(12) United States Patent
Murakami et al.

(10) Patent No.: US 11,793,082 B2
(45) Date of Patent: Oct. 17, 2023

(54) PIEZOELECTRIC BODY FILM, PIEZOELECTRIC ELEMENT, AND METHOD FOR MANUFACTURING PIEZOELECTRIC ELEMENT

(71) Applicant: FUJIFILM Corporation, Tokyo (JP)

(72) Inventors: Naoki Murakami, Kanagawa (JP); Daigo Sawaki, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 1078 days.

(21) Appl. No.: 16/560,325

(22) Filed: Sep. 4, 2019

(65) Prior Publication Data

US 2020/0006622 A1 Jan. 2, 2020

Related U.S. Application Data

(63) Continuation of application No. PCT/JP2018/008542, filed on Mar. 6, 2018.

(30) Foreign Application Priority Data

Mar. 31, 2017 (JP) .................................. 2017-070558

(51) Int. Cl.
*H01L 41/187* (2006.01)
*H10N 30/853* (2023.01)
(Continued)

(52) U.S. Cl.
CPC ....... *H10N 30/8554* (2023.02); *C01G 33/006* (2013.01); *C23C 14/08* (2013.01);
(Continued)

(58) Field of Classification Search
CPC ................. H10N 30/8554; H01L 41/1876
See application file for complete search history.

(56) References Cited

U.S. PATENT DOCUMENTS

| 10,103,316 B2 | 10/2018 | Murakami |
| 2005/0146249 A1 | 7/2005 | Miyazawa et al. |

(Continued)

FOREIGN PATENT DOCUMENTS

| JP | 2005-150694 A | 6/2005 |
| JP | 2006-083040 A | 3/2006 |

(Continued)

OTHER PUBLICATIONS

An Office Action mailed by the Japanese Patent Office dated Sep. 29, 2020, which corresponds to Japanese Patent Application No. 2019-509104 and is related to U.S. Appl. No. 16/560,325.

(Continued)

*Primary Examiner* — Bryan P Gordon

(74) *Attorney, Agent, or Firm* — Studebaker & Brackett PC

(57) ABSTRACT

To provide a piezoelectric body film and a piezoelectric element from which an excellent piezoelectric characteristic can be obtained even in a high-temperature environment and a method for manufacturing a piezoelectric element.

A piezoelectric body film of the present invention is a piezoelectric body film containing a perovskite-type oxide represented by Formula (1), in which a content q of Nb with respect to the number of all atoms in the perovskite-type oxide and a ratio r of a diffraction peak intensity from a (200) plane to a diffraction peak intensity from a (100) plane of the perovskite-type oxide, which is measured using an X-ray diffraction method, satisfy Formula (2), Formula (1) $A_{1+\delta}[(Zr_yTi_{1-y})_{1-x}Nb_x]O_z$, Formula (2) $0.35 \leq r/q < 0.58$, in this case, in Formula (1), A represents an A site element containing Pb, x and y each independently represent a numerical value of more than 0 and less than 1, standard values of $\delta$ and z each are 0 and 3, but these values may deviate from the (Continued)

standard values as long as the perovskite-type oxide has a perovskite structure, and, in Formula (2), a unit of q is atm %.

20 Claims, 1 Drawing Sheet

(51) Int. Cl.
  *C01G 33/00*  (2006.01)
  *C23C 14/08*  (2006.01)
  *C23C 14/34*  (2006.01)
  *H10N 30/076*  (2023.01)

(52) U.S. Cl.
  CPC ........... *C23C 14/34* (2013.01); *H10N 30/076* (2023.02); *C01P 2002/34* (2013.01); *C01P 2002/50* (2013.01); *C01P 2002/74* (2013.01); *C01P 2006/40* (2013.01)

(56) References Cited

U.S. PATENT DOCUMENTS

| | | | |
|---|---|---|---|
| 2006/0062723 A1 | 3/2006 | Noguchi | |
| 2006/0127482 A1* | 6/2006 | Fewell | A61K 31/17 514/45 |
| 2007/0216261 A1* | 9/2007 | Higuchi | H10N 30/853 310/358 |
| 2009/0066188 A1* | 3/2009 | Naono | B41J 2/14233 29/25.35 |
| 2009/0184290 A1* | 7/2009 | Kijima | H01L 21/02282 252/182.12 |
| 2011/0316393 A1* | 12/2011 | Naono | H10N 30/076 204/192.1 |
| 2013/0250007 A1* | 9/2013 | Ishimori | B41J 2/1628 204/192.1 |
| 2019/0103550 A1* | 4/2019 | Kobayashi | B25J 9/12 |

FOREIGN PATENT DOCUMENTS

| | | |
|---|---|---|
| JP | 2007-251388 A | 9/2007 |
| JP | 2009-065049 A | 3/2009 |
| JP | 2011-181720 A | 9/2011 |
| JP | 2012-009677 A | 1/2012 |
| JP | 2016-103567 A | 6/2016 |

OTHER PUBLICATIONS

International Search Report issued in PCT/JP2018/008542; dated May 1, 2018.

Written Opinion issued in PCT/JP2018/008542; dated May 1, 2018.

Extended European Search Report issued by the European Patent Office dated Jan. 10, 2020, which corresponds to EP18777381.7-1212 and is related to U.S. Appl. No. 16/560,325.

* cited by examiner

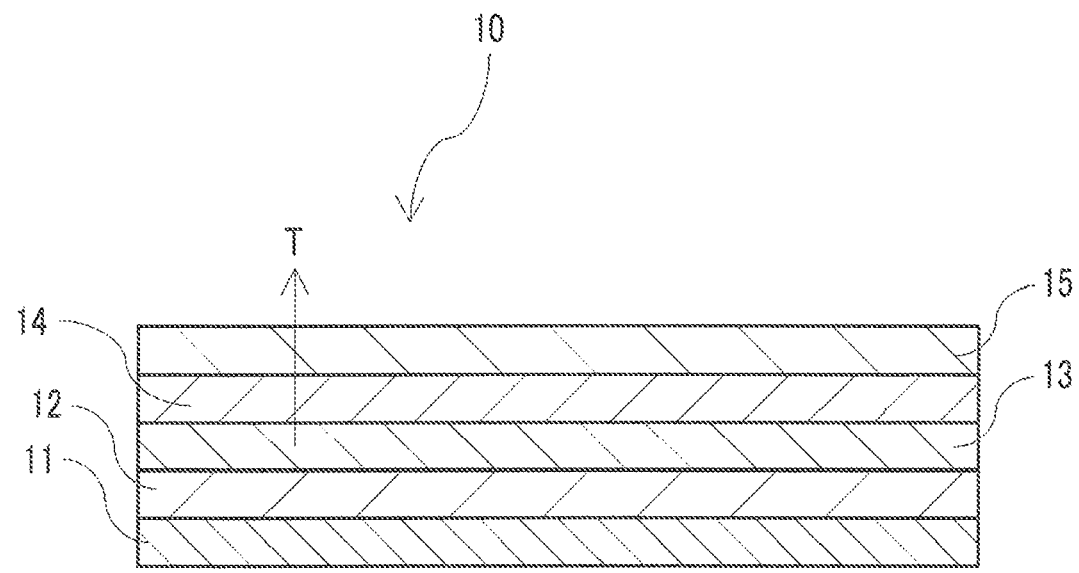

PIEZOELECTRIC BODY FILM, PIEZOELECTRIC ELEMENT, AND METHOD FOR MANUFACTURING PIEZOELECTRIC ELEMENT

CROSS-REFERENCE TO RELATED APPLICATIONS

This application is a Continuation of PCT International Application No. PCT/JP2018/008542 filed on Mar. 6, 2018, which claims priority under 35 U.S.C. § 119(a) to Japanese Patent Application No. 2017-070558 filed on Mar. 31, 2017. The above application is hereby expressly incorporated by reference, in its entirety, into the present application.

BACKGROUND OF THE INVENTION

1. Field of the Invention

The present invention relates to a piezoelectric body film, a piezoelectric element, and a method for manufacturing a piezoelectric element.

2. Description of the Related Art

Piezoelectric body films for which a perovskite-type oxide ($ABO_3$) such as lead zirconate titanate is used are known. Piezoelectric elements having the piezoelectric body film and an electrode provided so as to be capable of applying an electric field to the piezoelectric body film are being used in a variety of devices as, for example, an actuator.

As the above-described technique, JP2005-150694A describes "a piezoelectric body film represented by a general formula of $A_{1-b}B_{1-a}X_aO_3$, in which A includes Pb, B consists of at least one of Zr and Ti, X consists of at least one of V, Nb, Ta, Cr, Mo, and W, a is in a range of $0.05 \leq a \leq 0.3$, and b is in a range of $0.025 \leq b \leq 0.15$".

SUMMARY OF THE INVENTION

As a result of studying the piezoelectric body film described in JP2005-150694A, the present inventors clarified that there is a problem with a leak current increasing in a high-temperature environment.

Therefore, an object of the present invention is to provide a piezoelectric body film in which an increase in a leak current in a high-temperature environment is suppressed (hereinafter, also referred to as "having an effect of the present invention"). In addition, another object of the present invention is to provide a piezoelectric element and a method for manufacturing a piezoelectric element.

As a result of intensive studies for achieving the above-described objects, the present inventors found that the objects can be achieved by the following configuration.

[1] A piezoelectric body film comprising: a perovskite-type oxide represented by Formula (1), in which a content q of Nb with respect to the number of all atoms in the perovskite-type oxide and a ratio r of a diffraction peak intensity from a (200) plane to a diffraction peak intensity from a (100) plane of the perovskite-type oxide, which is measured using an X-ray diffraction method, satisfy Expression (2), Formula (1) $A_{1+\delta}[(Zr_yTi_{1-y})_{1-x}Nb_x]O_z$, Expression (2) $0.35 \leq r/q < 0.58$, in this case, in Formula (1), A represents an A site element containing Pb, x and y each independently represent a numerical value of more than 0 and less than 1, standard values of $\delta$ and z each are 0 and 3, but these values may deviate from the standard values as long as the perovskite-type oxide has a perovskite structure, and, in Expression (2), a unit of q is atm %.

[2] The piezoelectric body film according to [1], in which x in Formula (1) is 0.1 to 0.15.

[3] The piezoelectric body film according to [1] or [2], in which a content of Pb in the perovskite-type oxide is 20.7 atm % or more and less than 22 atm % of the number of all of the atoms in the perovskite-type oxide.

[4] The piezoelectric body film according to any one of [1] to [3], in which a ratio in terms of the number of contained atoms of the content of Pb to the content of Nb in the perovskite-type oxide exceeds 7.0.

[5] The piezoelectric body film according to [4], in which, in a case where the number of all of the atoms contained in the perovskite-type oxide is set to 100 atm %, the content of Nb is 2.3 atm % or less or the content of Pb is 20.8 atm % or more.

[6] The piezoelectric body film according to any one of [1] to [5], in which the piezoelectric body film is a columnar crystal film consisting of a columnar crystal of the perovskite-type oxide.

[7] The piezoelectric body film according to any one of [1] to [6], in which a film thickness is 1 μm or more.

[8] A piezoelectric element comprising: the piezoelectric body film according to any one of [1] to [7]; and an electrode.

[9] A method for manufacturing a piezoelectric element comprising a substrate, a lower electrode, the piezoelectric body film according to any one of [1] to [7], and an upper electrode in this order, the method comprising: a step of obtaining an electrode-attached substrate by forming the lower electrode on the substrate; a step of depositing a perovskite-type oxide on the electrode-attached substrate using a vapor-phase growth method by holding a temperature of the electrode-attached substrate at $T_1$, a step of obtaining a piezoelectric body film by holding the temperature of the electrode-attached substrate on which the perovskite-type oxide is deposited at $T_2$ and, furthermore, depositing the perovskite-type oxide, and a step of obtaining a piezoelectric element by forming the upper electrode on the piezoelectric body film, in which $T_1$ and $T_2$ satisfy Expression (3) $1.04 < T_1/T_2 < 1.12$.

[10] The method for manufacturing a piezoelectric element according to [9], in which the vapor-phase growth method is sputtering.

According to the present invention, it is possible to provide a piezoelectric body film in which an increase in a leak current in a high-temperature environment is suppressed. In addition, according to the present invention, it is possible to provide a piezoelectric element and a method for manufacturing a piezoelectric element.

BRIEF DESCRIPTION OF THE DRAWINGS

The FIGURE is a cross-sectional schematic view of a piezoelectric element according to an embodiment of the present invention.

DESCRIPTION OF THE PREFERRED EMBODIMENTS

Hereinafter, the present invention will be described in detail.

Configurational conditions to be described below will be described on the basis of a typical embodiment of the present invention in some cases, but the present invention is not limited to such an embodiment.

Meanwhile, in the present specification, numerical ranges expressed using "to" include numerical values before and after the "to" as the lower limit value and the upper limit value.

[Piezoelectric Element]

The FIGURE is a cross-sectional schematic view of a piezoelectric element according to an embodiment of the present invention. A piezoelectric element 10 comprises a substrate 11, an adhesive layer 12, a lower electrode 13, a piezoelectric body film 14, and an upper electrode 15. The piezoelectric body film 14 is sandwiched between a pair of electrodes (the lower electrode 13 and the upper electrode 15). In the piezoelectric element 10, an electric field can be applied to the piezoelectric body film 14 through the pair of electrodes.

The piezoelectric element 10 according to the embodiment of the present invention comprises the adhesive layer 12; however, in a case where there is no problem with adhesiveness between the substrate and the lower electrode, the piezoelectric element may not comprise the adhesion layer. In addition, the piezoelectric element may comprise a buffer layer instead of the adhesive layer 12 or together with the adhesive layer 12. Hereinafter, the respective members of the piezoelectric element 10 according to the embodiment of the present invention will be described.

[Piezoelectric Body Film]

A piezoelectric body film according to an embodiment of the present invention is a piezoelectric body film containing a perovskite-type oxide represented by Formula (1), in which a content q (atm %) of Nb with respect to the number of all atoms in the perovskite-type oxide and a ratio r of a diffraction peak intensity from a (200) plane to a diffraction peak intensity from a (100) plane of the perovskite-type oxide, which is measured using an X-ray diffraction method, satisfy Expression (2) described below.

A reason that the piezoelectric body film according to the embodiment of the present invention having the above-described configuration is capable of achieving the above-described object is not clear, but the present inventors assume as described below. Meanwhile, the following assumption does not limit a mechanism of obtaining an effect. In other words, even in a case where the effect is obtained according to a mechanism other than the mechanism described below, the piezoelectric body film is included in the scope of the present invention.

The present inventors intensively studied a reason for a leak current decreasing in the case of using the piezoelectric body film described in JP2005-150694A in a high-temperature environment. Meanwhile, in the present specification, the leak current refers to a current that is measured using a method described in examples.

The piezoelectric body film described in JP2005-150694A contains, in addition to Zr and Ti that are atoms capable of becoming tetravalent, V, Nb, Ta, Cr, Mo, and W that are capable of having a higher valence. According to the studies by the present inventors, it is considered that, in a case where an element capable of having a large valence is added to a B site of a perovskite-type oxide ($ABO_3$), it becomes difficult to achieve a balance of charges in a crystal of the perovskite-type oxide. In the case of using a piezoelectric body film in which the above-described perovskite-type oxide is used in a high-temperature environment, it is assumed that it becomes easy for a defect to be generated in the crystal of the perovskite-type oxide. This defect is assumed to generate the leak current in a high-temperature environment and result in an increase in the generated leak current. That is, in a case where the content of Nb in perovskite is too high, there is a possibility that the leak current also may increase.

One of the characteristics of the piezoelectric body film according to the present embodiment is the relationship between the ratio (200)/(100) in the diffraction intensity by X-ray diffraction and the content of lead controlled to be in a predetermined range.

Here, (200)/(100) is a parameter that is assumed to reflect the amount of a defect present in the (200) plane. That is, it is assumed that, as the amount of the defect in the (200) plane decreases, (200)/(100) increases. The defect in the (200) plane is assumed to be buried by Pb that is contained in the perovskite-type oxide. Meanwhile, it is assumed that, in a case where the amount of Pb that is contained in the perovskite-type oxide is too large, excess Pb is not incorporated into a crystal lattice, but is present in a grain boundary. In this case, Pb acts as a leak path and consequently increases the leak current in a high-temperature environment.

In the piezoelectric body film according to the present embodiment, the ratio of r (r represents (200)/(100)) to q (q represents the content (atm %) of Nb in the case of setting the number of all of the atoms that are contained in the perovskite-type oxide to 100 atm %) is 0.35 or more and less than 0.58. In a case where r/q is 0.35 or more, the amount of a defect generated by Nb contained is small, and the defect is buried by Pb, and, in a case where r/q is less than 0.58, the leak current attributed to Pb is not easily generated. Therefore, according to the piezoelectric body film according to the present embodiment, a desired characteristic can be obtained even in a high-temperature environment.

The piezoelectric body film according to the present embodiment preferably has a perovskite-type oxide that is preferentially oriented in the (100) plane and the (200) plane. In the present specification, preferential orientation refers to a state in which the orientation direction of crystals is not in disorder and a specific crystal plane is oriented in an almost constant direction. For example, "being preferentially oriented in the (100) plane" refers to the fact that the ratio (100)/((100) plane+(110) plane+(111) plane) in the diffraction peak intensities from the (100) plane, the (110) plane, and the (111) plane of the perovskite-type oxide that are generated in the case of measuring the piezoelectric body film using an X-ray diffraction method is larger than 0.5, which is also true for the (200) plane.

Particularly, in a case where the piezoelectric body film in the embodiment of the present invention is a columnar crystal film of the perovskite-type oxide, a C axis of the columnar crystal is preferably oriented in a film thickness direction (a T direction in the FIGURE) of the piezoelectric body film.

The Piezoelectric body film according to the embodiment contains a perovskite-type oxide represented by Formula (1). The content of the perovskite-type oxide in the piezoelectric body film is not particularly limited, but is preferably 90% by mass or more and more preferably 99% by mass or more since a piezoelectric body film being superior in terms of the effect of the present invention can be obtained, and the piezoelectric body film preferably substantially consists of the perovskite-type oxide. Meanwhile, the expression "the piezoelectric body film substantially consists of the perovskite-type oxide" means that the piezoelectric body film does not contain components other than the perovskite-type oxide (however, except for an impurity or the like that is mixed thereinto unintentionally).

$$A_{1+\delta}[(Zr_yTi_{1-y})_{1-x}Nb_x]O_z \quad \text{Formula (1)}$$

In Formula (1), A represents an A element containing Pb, x and y each independently represent a numerical value of more than 0 and less than 1. Standard values of δ and z each are 0 and 3, but these values may deviate from the standard values as long as the perovskite-type oxide has a perovskite structure.

In addition, the perovskite-type oxide may contain elements other than the above-described element as an impurity as long as the perovskite structure can be held.

Meanwhile, in the present specification, A will also be referred to as the A site element, and Zr, Ti, and Nb will also be referred to as the B site element.

In Formula (1), A represents an A element containing Pb and typically represents Pb. Part of A may be substituted with a metal element other than Pb. As the metal element other than Pb, for example, Ba, Bi, and the like are exemplified.

In a case where A consists of Pb, the perovskite-type oxide represented by Formula (1) is represented by Formula (1-1).

$$Pb_{1+\delta}[(Zr_yTi_{1-y})_{1-x}Nb_x]O_z \quad \text{Formula (1-1)}$$

x is more than 0 and less than 1, y is more than 0 and less than 1, and the standards of δ and z are 0 and 3, but these values may deviate from the standard values as long as the perovskite-type oxide has a perovskite structure.

In Formula (1) and Formula (1-1), the value of y is not particularly limited, but is preferably near 0.52 that is a morphotropic phase boundary (MPB) since a piezoelectric body film being superior in terms of the effect of the present invention can be obtained.

The content q (atm %) of Nb in the perovskite-type oxide and the ratio r of the diffraction peak intensity from the (200) plane to the diffraction peak intensity from the (100) plane of the perovskite-type oxide, which is measured using an X-ray diffraction method, satisfy Expression (2).

$$0.35 \leq r/q < 0.58 \quad \text{Expression (2)}$$

Here, the value r/q represents a two-digit accuracy ratio that is obtained from the content (unit: atm %, two-digit accuracy) of Nb in the perovskite-type oxide and the measurement results (three-digit accuracy) of the diffraction peak intensities from the (100) and (200) planes of the perovskite-type oxide, which is measured using an X-ray diffraction method. For example, in Example 4 described below, (200)/(100) is 0.830, the content of Nb is 2.4 atm %, and r/q is calculated to be 0.35 by being rounded off to three digits.

Meanwhile, in the present specification, the content (atm %) of Nb in the perovskite-type oxide refers to a value that is measured using X-ray fluorescence (XRF) or inductively coupled plasma (ICP).

The lower limit value of r/q is 0.35 or more, but is preferably more than 0.36, more preferably 0.37 or more, and still more preferably 0.39 or more since a piezoelectric body film to be obtained is superior in terms of the effect of the present invention. The upper limit value is less than 0.58, but is preferably 0.57 or less and more preferably 0.55 or less since a piezoelectric body film to be obtained is superior in terms of the effect of the present invention.

In the perovskite-type oxide, the content of Nb in a B site (which represents the content of Nb in the case of setting the number of all atoms in the B site to 100 atm % and has a unit of atm %) is not particularly limited, but is preferably 10 to 15 atm % and more preferably 10 to 12 atm % in the case of setting the number of all of the atoms in the B site to 100 atm % since a piezoelectric body film being superior in terms of the effect of the present invention can be obtained. In the case of expressing the above description using x in Formula (1) and Formula (1-1), x is preferably 0.10 to 0.15 and more preferably 0.10 to 0.12.

The content (atm %) of Nb in the perovskite-type oxide is not particularly limited; however, in the case of setting the number of all of the atoms contained in the perovskite-type oxide to 100 atm %, the lower limit value is preferably 2.0 atm % or more, and the upper limit value is preferably 3.0 atm % or less, more preferably less than 3.0 atm %, still more preferably 2.9 atm % or less, and particularly preferably 2.4 atm % or less.

The content (atm %) of Pb in the perovskite-type oxide is not particularly limited; however, in the case of setting the number of all of the atoms contained in the perovskite-type oxide to 100 atm %, the lower limit value is preferably 20.0 atm % or more, and the upper limit value is preferably 22.0 atm % or less, more preferably less than 22.0 atm %, and still more preferably 21.5 atm % or less.

The ratio in terms of the number of contained atoms of the content (atm %) of Pb to the content (atm %) of Nb in the perovskite-type oxide is not particularly limited; however, since a piezoelectric body film being superior in terms of the effect of the present invention can be obtained, the ratio of the content (atm %) of Pb to the content (atm %) of Nb is preferably 6.9 or more, more preferably more than 7.0, still more preferably more than 8.6, particularly preferably 8.7 or more, and most preferably 8.8 or more. The upper limit value is preferably 12 or less and more preferably 11 or less. Meanwhile, the units of the content of Nb and the content of Pb are atm % in the case of setting the number of all of the atoms contained in the perovskite-type oxide to 100 atm %.

In a case where the ratio of the content (atm %) of Pb to the content (atm %) of Nb is 8.8 or more and 11 or less, the piezoelectric body film is superior in terms of the effect of the present invention.

Meanwhile, in the present specification, the ratio of the content (atm %) of Pb to the content (atm %) of Nb is a coefficient that is calculated in a two-digit accuracy. For example, in Example 2 described below, the content of Nb is 2.0 atm %, and the content of Pb is 21.0 atm %. Therefore, the ratio of the content (atm %) of Pb to the content (atm %) of Nb is 21.0/2.0=10.5 and becomes 11 by being rounded to three digits.

As another preferred aspect of the perovskite-type oxide, an aspect in which the ratio of the content (atm %) of Pb to the content (atm %) of Nb exceeds 7.0, and, in the case of setting the number of all of the atoms contained in the perovskite-type oxide to 100 atm %, the content (atm %) of Nb is 2.3 atm % or less or the content (atm %) of Pb is 20.8 atm % or more is exemplified.

The piezoelectric body film is preferably a columnar crystal film consisting of a columnar crystal in which the crystal structure of the perovskite-type oxide extends in the film thickness direction (a direction T in the FIGURE) of the piezoelectric body film. In a case where the perovskite-type oxide has a columnar structure, it is easy to further thicken the film thickness of the piezoelectric body film. Meanwhile, the columnar crystal film preferably consists of a number of the columnar crystals.

The average column diameter of the columnar crystals is not particularly limited, but is preferably 30 nm to 1.0 μm. In a case where the average column diameter of the columnar crystals is 30 nm or more, the influence of a domain boundary portion becomes smaller, and thus a piezoelectric body film in which the leak current is further suppressed can be obtained. On the other hand, in a case where the average column diameter of the columnar crystals is 1.0 µm or less, in the case of patterning the piezoelectric body film, a piezoelectric body film having a more favorable shape accuracy can be obtained.

The film thickness of the piezoelectric body film is not particularly limited, but is preferably 500 nm or more, more preferably 1.0 µm or more, and still more preferably 2.0 µm or more since the durability of the piezoelectric body film is more favorable. The upper limit of the film thickness of the piezoelectric body film is not particularly limited, but is preferably 20 µm or less and more preferably 10 µm or less.

<Method for Manufacturing Piezoelectric Body Film>

A method for manufacturing the piezoelectric body film (hereinafter, also referred to as "forming the piezoelectric body film") is not particularly limited, and a well-known method can be used.

As the method for forming the piezoelectric body film, for example, vapor-phase growth methods such as a plasma chemical vapor deposition (CVD) method, a metal organic chemical vapor deposition (MOCVD) method, and a pulse laser deposition (PLD) method; liquid-phase methods such as a sol-gel method and an organic metal decomposition method; an aerosol deposition method; and the like are exemplified.

Among these, as the method for manufacturing the piezoelectric body film, the vapor-phase growth method is preferred since it is easy to control film formation conditions. In addition, according to the vapor-phase growth method, it is possible to suppress the generation of horizontal stripes in the piezoelectric body film during the formation of the film, and a piezoelectric body film having more favorable durability can be obtained.

The method for manufacturing the piezoelectric body film using the vapor-phase growth method is not particularly limited, and, typically, a method in which a substrate and a target are made to face each other and a film containing a configurational element of the target is formed on the substrate using plasma is exemplified. Meanwhile, as the substrate, a base material, an electrode-attached substrate, and the like described below are exemplified.

As the vapor-phase growth method, for example, a dipolar sputtering method, a tripolar sputtering method, a direct-current sputtering method, a radio frequency (RF) sputtering method, an electron cyclotron resonance (ECR) sputtering method, a magnetron sputtering method, a facing target sputtering method, a pulse sputtering method, an ion beam sputtering method, and the like are exemplified.

Among these, the vapor-phase growth method is preferably a sputtering method (particularly, a radio frequency sputtering method is preferred), an ion plating method, or a plasma CVD method and more preferably a sputtering method since a piezoelectric body film being superior in terms of the effect of the present invention can be obtained.

In a case where the method for manufacturing the piezoelectric body film is a sputtering method, the perovskite-type oxide in a piezoelectric body film to be obtained is likely to be a columnar crystal that is oriented along the C axis in the thickness direction (the T direction in the FIGURE) of the piezoelectric body film.

[Substrate]

The substrate 11 in the piezoelectric element 10 according to the present embodiment is not particularly limited, and a well-known substrate can be used. As the substrate, for example, substrates of silicon, glass, stainless steel, yttria-stabilized zirconia (YSZ), $SrTiO_3$, alumina, sapphire, silicon carbide, and the like are exemplified.

In addition, as the substrate, a laminate substrate such as a silicon on insulator (SOI) substrate having a $SiO_2$ film and a Si active layer sequentially laminated on silicon may also be used.

[Adhesive Layer]

The piezoelectric element 10 according to the present embodiment comprises the adhesive layer 12 for improving the adhesiveness between the substrate 11 and the lower electrode 13. The adhesive layer 12 is not particularly limited, and a well-known material can be used. As the material of the adhesive layer, for example, Ti, TiW, and the like are exemplified.

[Lower Electrode]

The lower electrode 13 is an electrode for applying an electric field to the piezoelectric body film 14 and forms a pair with the upper electrode 15. The material of the lower electrode 13 is not particularly limited, and a well-known material can be used. As the material of the lower electrode 13, for example, metal such as Au, Pt, Ir, $IrO_2$, $RuO_2$, $LaNiO_3$, $SrRuO_3$, indium tin oxide (ITO), and titanium nitride (TiN), metal oxides, transparent conductive materials, and combinations thereof are exemplified. Among these, the lower electrode particularly preferably contains Ir.

The film thickness of the lower electrode is not particularly limited, but is preferably 50 to 500 nm.

[Upper Electrode]

The material of the upper electrode 15 is not particularly limited, and a well-known material can be used. As the material of the upper electrode 15, for example, the materials described as the material of the lower electrode 13, electrode materials that are generally used in a semiconductor process such as Al, Ta, Cr, and Cu, and combinations thereof are exemplified.

The film thickness of the upper electrode is not particularly limited, but is preferably 50 to 500 nm.

The piezoelectric element according to the present embodiment can be used in a variety of uses. Typically, the piezoelectric element according to the present embodiment can be used as an actuator and, specifically, can be applied as a wearable device, a touch pad, a display, a controller, and the like. In addition, the piezoelectric element according to the present embodiment can also be used as a sensor or the like. Among these, the piezoelectric element according to the present embodiment is capable of exhibiting a predetermined characteristic even under a high-temperature environment and is thus preferable as a mechanical component demanding high reliability.

[Method for Manufacturing Piezoelectric Element]

A method for manufacturing a piezoelectric element according to the present embodiment is not particularly limited, and a well-known method can be used. For example, a method in which the lower electrode, the adhesive layer, the piezoelectric body film, and the upper electrode are laminated on the substrate in this order using the film formation method described in the section of the method for manufacturing the piezoelectric body film is exemplified. Particularly, the method for manufacturing a piezoelectric element preferably has the following steps since a piezoelectric element being superior in terms of the effect of the present invention can be obtained.

(1) A step of obtaining an electrode-attached substrate by forming the lower electrode on the substrate (low electrode formation step)

(2) A step of depositing a perovskite-type oxide on the electrode-attached substrate using a vapor-phase growth method by holding the temperature of the electrode-attached substrate at $T_1$ (initial phase step)

(3) A step of obtaining a piezoelectric body film by further depositing a perovskite-type oxide using a vapor-phase growth method by holding the temperature of the electrode-attached substrate on which the perovskite-type oxide has been deposited at $T_2$ (final phase step)

(4) A step of obtaining a piezoelectric element by forming the upper electrode on the piezoelectric body film (upper electrode formation step)

Hereinafter, the respective steps will be described in detail. Meanwhile, in the following description, members to be used and materials are as already described above and will not be described.

[Low Electrode Formation Step]

The low electrode formation step is a step of forming the lower electrode on the substrate. A method for forming the lower electrode is not particularly limited, and a well-known method can be used. As the method for forming the lower electrode, for example, the method already described as the method for forming the piezoelectric body film and the like are exemplified.

[Initial Phase Step]

The initial phase step is a step of depositing a perovskite-type oxide on the electrode-attached substrate obtained in the lower electrode formation step using a vapor-phase growth method.

The temperature $T_1$ of the electrode-attached substrate in the initial phase step is not particularly limited, but is preferably set to a temperature at which the perovskite-type oxide can be deposited on the substrate, in other words, a temperature at which the oxide represented by Formula (1) is capable of growing as perovskite. As long as being an ordinary film formation condition, the temperature $T_1$ is preferably 450° C. to 700° C., more preferably 500° C. to 650° C., and still more preferably 550° C. to 600° C.

In addition, the temperature $T_1$ of the electrode-attached substrate in the initial phase step and the temperature $T_2$ described below satisfy Expression (3).

$$1.04 < T_1/T_2 < 1.12 \qquad \text{Expression (3)}$$

$T_1/T_2$ is not particularly limited as long as $T_1/T_2$ is larger than 1.04, but is preferably 1.05 or more and more preferably 1.06 or more. The upper limit value is not particularly limited as long as the upper limit value is less than 1.12, but is preferably 1.10 or less. In a case where $T_1/T_2$ is larger than 1.04, the temperature $T_1$ of the electrode-attached substrate during the formation of the film is relatively higher, the perovskite-type oxide is reliably synthesized in the initial phase step and, in the final phase step described below, is likely to act as a seed during the additional deposition of the perovskite-type oxide.

The thickness of the perovskite-type oxide that is deposited in the initial phase step is preferably set to 100 nm or more. The perovskite-type oxide film functions as a seed layer at the time of further depositing a perovskite-type oxide in the final phase step described below. The upper limit of the thickness of the perovskite-type oxide that is deposited in the initial phase step is not particularly limited; however, generally, is preferably equal to or less than half of the total film thickness of the piezoelectric body film.

The vapor-phase growth method is not particularly limited, and well-known methods (the methods that has already been described) are exemplified. Among them, the sputtering method is preferred, and the radio frequency sputtering method is more preferred since the control of the film thickness is easier.

[Final Phase Step]

The final phase step is a step of obtaining a piezoelectric body film by further depositing a perovskite-type oxide using a vapor-phase growth method by holding the temperature of the electrode-attached substrate on which the perovskite-type oxide has been deposited at $T_2$.

The temperature $T_2$ of the electrode-attached substrate in the final phase step is not particularly limited, but is preferably set to a temperature at which the perovskite-type oxide can be deposited on the substrate, in other words, a temperature at which the oxide represented by Formula (1) is capable of growing as perovskite. As long as being an ordinary film formation condition, the temperature $T_2$ is preferably 400° C. to 650° C., more preferably 450° C. to 600° C., and still more preferably 500° C. to 550° C.

In the final phase step, the temperature $T_2$ of the electrode-attached substrate is controlled to be lower than in the initial phase step, and thus it is easy to control the content of Pb in the perovskite-type oxide (so-called lead leakage does not easily occur).

The relationship between the temperature $T_1$, the temperature $T_2$, and x in Formula (1) (in other words, the amount of Nb doped into the B site) is not particularly limited, but preferably satisfies Expression (4) since a piezoelectric body film being superior in terms of the effect of the present invention can be obtained.

$$T_1/T_2 > 0.8x + 0.96 \qquad \text{Expression (4)}$$

In addition, the vapor-phase growth method is not particularly limited, and well-known methods (the methods that has already been described) are exemplified. Among them, the sputtering method is preferred, and the radio frequency sputtering method is more preferred since the control of the film thickness is easier.

[Upper Electrode Formation Step]

The upper electrode formation step is a step of obtaining a piezoelectric element by forming the upper electrode on the piezoelectric body film obtained in the final phase step. A method for forming the upper electrode is not particularly limited, and a well-known method can be used. As the method for forming the upper electrode, for example, the method already described as the method for forming the piezoelectric body film and the like are exemplified.

[Other Steps]

The method for manufacturing a piezoelectric element according to the embodiment of the present invention may have other steps as long as the effect of the present invention is exhibited. As the other steps, for example, an adhesive layer formation step is exemplified. As the adhesive layer formation step, typically, a step of forming the adhesive layer between the substrate and the lower electrode is exemplified, and a well-known method can be used.

EXAMPLES

Hereinafter, the present invention will be described in more detail on the basis of examples. Materials, amounts used, proportions, processing contents, processing orders, and the like described in the following examples can be appropriately changed within the scope of the gist of the present invention. Therefore, the scope of the present invention is not supposed to be interpreted in a limited manner by the examples described below.

First, as a substrate for forming a piezoelectric body film, an electrode-attached substrate having a Ti adhesive layer (corresponding to the adhesive layer) having a film thickness of 10 nm and an Ir lower electrode (corresponding to the lower electrode) having a film thickness of 300 nm sequentially laminated on a 25 mm×25 mm silicon on insulator (SOI, corresponding to the substrate) was prepared.

Next, the electrode-attached substrate was placed in a radio frequency (RF) sputtering device, and a piezoelectric body film having a film thickness of 2 μm was formed under conditions of a degree of vacuum of 0.3 Pa and an Ar/$O_2$ mixed atmosphere ($O_2$ volume partial fraction: 2.0%) by setting the Zr/(Zr+Ti) ratio in a target to 0.52 and using a lead zirconate titanate target in which the content of Nb had been adjusted in advance so that the amount of Nb doped into a B site of a piezoelectric body film to be formed reached 10%, 12%, and 15%.

Meanwhile, the substrate temperature during the formation of the film was controlled, thereby changing the diffraction peak intensity r ((200)/(100) ratio) of a perovskite-type oxide. Specifically, films in Table 1 were produced by changing the film formation temperature stepwise using an initial phase step of forming the film until the film thickness of the piezoelectric body film reached 100 nm or more and, subsequent to the initial phase step, a final phase step of forming the film up to a target film thickness of the piezoelectric body film in a process for manufacturing the piezoelectric body film. Meanwhile, film formation conditions of individual examples and individual comparative examples are summarized in Table 1.

As a result of carrying out analyses of the crystal structure using an X-ray diffraction method on the piezoelectric body films of the individual examples and the individual comparative examples formed using the methods shown in Table 1, it was found that all of the crystal structures were preferentially oriented in a (100) plane and a (200) plane. In addition, as a result of analyzing elements by XRF and ICP, it was found that the piezoelectric body films were the single-phase films of the perovskite-type oxide represented by Formula (1).

Next, a Pt upper electrode having a film thickness of 100 nm was laminated on the piezoelectric body films, thereby obtaining piezoelectric elements.

[Evaluation of Increase in Leak Current Density]

In a 25° C. environment, a sweep of changing a voltage that was applied between the electrodes of the piezoelectric body film of each of the examples and the comparative examples in a range of −2 V to −50 V at intervals of 2 V was repetitively carried out five times, and a difference in current under the application of −50 V between a fifth measurement and a first measurement was measured as the leak current. The degree of the leak current was divided by the area of the electrode, thereby computing the leak current density (A/cm$^2$). Next, in a 200° C. environment, the same test as described above was carried out, and the leak current density (A/cm$^2$) was computed. An increase in the leak current density (A/cm$^2$) was calculated from the results using the following expression and evaluated using the following standards. The calculated increases in the leak current density and the results are shown in Table 1.

Increase in leak current density (A/cm$^2$)=leak current density (A/cm$^2$) in 200° C. environment−leak current density (A/cm$^2$) in 25° C. environment    (Expression)

—Evaluation Standards—
A: The increase in the leak current density is less than $1.0 \times 10^{-8}$ A/cm$^2$.
B: The increase in the leak current density is $1.0 \times 10^{-8}$ A/cm$^2$ or more and less than $1.0 \times 10^{-6}$ A/cm$^2$.
C: The increase in the leak current density is $1.0 \times 10^{-7}$ A/cm$^2$ or more and less than $5.0 \times 10^{-6}$ A/cm$^2$.
D: The increase in the leak current density is $5.0 \times 10^{-6}$ A/cm$^2$ or more and less than $1.0 \times 10^{-5}$ A/cm$^2$.
E: The increase in the leak current density is $1.0 \times 10^{-5}$ A/cm$^2$ or more.

TABLE 1-1

| | Film formation condition | | | | |
|---|---|---|---|---|---|
| | Amount of Nb doped into B site (atm %) | A: Film formation temperature in initial phase step (° C.) | B: Film formation temperature in final phase step (° C.) | Film formation temperature ratio $T_1/T_2$ | Thickness of piezoelectric body film (μm) |
| Example 1 | 10% | 570 | 540 | 1.06 | 2.0 |
| Example 2 | 10% | 570 | 530 | 1.08 | 2.0 |
| Example 3 | 10% | 570 | 520 | 1.10 | 2.0 |
| Example 4 | 12% | 570 | 540 | 1.06 | 2.0 |
| Example 5 | 12% | 570 | 530 | 1.08 | 2.0 |
| Example 6 | 12% | 570 | 520 | 1.10 | 2.0 |
| Example 7 | 15% | 570 | 520 | 1.10 | 2.0 |
| Comparative Example 1 | 10% | 570 | 550 | 1.04 | 2.0 |
| Comparative Example 2 | 10% | 570 | 510 | 1.12 | 2.0 |

TABLE 1-2

| | Structure and the like of obtained perovskite-type oxide | | | | Evaluation | |
|---|---|---|---|---|---|---|
| | [C] (200)/(100) | [D] Content of Nb (atm %) | [E] Content of Pb (atm %) | [E]/[D] | Increase in leak current density (A/cm$^2$) | |
| Example 1 | 0.82 | 2.0 | 20.7 | 10 | $6.1 \times 10^{-9}$ | A |
| Example 2 | 0.93 | 2.0 | 21.0 | 11 | $3.1 \times 10^{-9}$ | A |
| Example 3 | 1.10 | 2.0 | 21.5 | 11 | $2.0 \times 10^{-9}$ | A |
| Example 4 | 0.83 | 2.4 | 20.7 | 8.6 | $3.1 \times 10^{-6}$ | C |
| Example 5 | 0.94 | 2.4 | 20.9 | 8.7 | $1.2 \times 10^{-8}$ | B |
| Example 6 | 1.07 | 2.4 | 21.2 | 8.8 | $8.1 \times 10^{-9}$ | A |
| Example 7 | 1.07 | 3.0 | 20.9 | 7.0 | $7.0 \times 10^{-6}$ | D |
| Comparative Example 1 | 0.62 | 2.0 | 20.5 | 10 | $1.4 \times 10^{-5}$ | E |
| Comparative Example 2 | 1.15 | 2.0 | 22.0 | 11 | $2.1 \times 10^{-5}$ | E |

In the table, the film formation conditions, structure, and evaluation of the piezoelectric body film each of the examples and the comparative examples are shown in each row of Table 1-1 and Table 1-2. For example, for the piezoelectric body film of Example 1, a film formation condition under which the thickness of the piezoelectric body film reached 2.0 μm was formed by adjusting the amount of Nb doped into the B site to reach 10 atm % in the case of setting the total of the atoms in the B site to 100 atm %, setting the film formation temperature in the initial phase step to 570° C., and setting the film formation temperature in the final phase step to 540° C. (therefore, $T_1/T_2$ was 1.06). Meanwhile, regarding the structure of the obtained perovskite-type oxide, the ratio r of the diffraction peak intensity from the (200) plane to the diffraction peak intensity from the (100) plane was 0.82, the content of Nb in the perovskite-type oxide was 2.0 atm %, and the content of Pb was 20.7 atm % (therefore, the ratio of the content of Pb to the content of Nb was 10). Here, the increase in the leak current density of the piezoelectric body film of Example 1 was $6.1 \times 10^{-9}$ A/cm², and the evaluation was "A". Meanwhile, for the other examples and the comparative examples, the items were measured using the same methods as described above, and the results are shown in Table 1.

The results shown in Table 1 show that the piezoelectric body films of Examples 1 to 7 had the effect of the present invention. On the other hand, the piezoelectric body films of Comparative Examples 1 and 2 did not have the effect of the present invention.

In the piezoelectric body film of Example 1 in which the ratio in terms of the number of contained atoms of the content of Pb to the content of Nb in the perovskite-type oxide exceeded 7.0, the increase in the leak current density was smaller than in the piezoelectric body film of Example 7.

In addition, in the piezoelectric body film of Example 1 in which, in the case of setting the number of all atoms contained in the perovskite-type oxide to 100 atm %, the content of Nb is 2.3 atm % or less or the content of Pb is 20.8 atm %, the increase in the leak current density was smaller than in the piezoelectric body film of Example 4.

EXPLANATION OF REFERENCES

10: piezoelectric element
11: substrate
12: adhesive layer
13: lower electrode
14: piezoelectric body film
15: upper electrode

What is claimed is:

1. A piezoelectric body film comprising:
a perovskite-type oxide represented by Formula (1),
wherein a content q of Nb with respect to the number of all atoms in the perovskite-type oxide and
a ratio r of a diffraction peak intensity from a (200) plane to a diffraction peak intensity from a (100) plane of the perovskite-type oxide, which is measured using an X-ray diffraction method, satisfy Expression (2), $$A_{1+\delta}[(Zr_y Ti_{1-y})_{1-x} Nb_x]O_z \quad \text{Formula (1)}$$

$$0.35 \leq r/q < 0.58 \quad \text{Expression (2)}$$

in this case, in Formula (1), A represents an A site element containing Pb, x and y each independently represent a numerical value of more than 0 and less than 1, standard values of δ and z each are 0 and 3, but these values may deviate from the standard values as long as the perovskite-type oxide has a perovskite structure, and, in Expression (2), a unit of q is atm %.

2. The piezoelectric body film according to claim 1, wherein x in Formula (1) is 0.1 to 0.15.

3. The piezoelectric body film according to claim 1, wherein a content of Pb in the perovskite-type oxide is 20.7 atm % or more and less than 22 atm % of the number of all of the atoms in the perovskite-type oxide.

4. The piezoelectric body film according to claim 1, wherein a ratio in terms of the number of contained atoms of the content of Pb to the content of Nb in the perovskite-type oxide exceeds 7.0.

5. The piezoelectric body film according to claim 4, wherein, in a case where the number of all of the atoms contained in the perovskite-type oxide is set to 100 atm %, the content of Nb is 2.3 atm % or less or the content of Pb is 20.8 atm % or more.

6. The piezoelectric body film according to claim 1, wherein the piezoelectric body film is a columnar crystal film consisting of a columnar crystal of the perovskite-type oxide.

7. The piezoelectric body film according to claim 1, wherein a film thickness is 1 μm or more.

8. A piezoelectric element comprising:
the piezoelectric body film according to claim 1; and
an electrode.

9. A method for manufacturing a piezoelectric element comprising a substrate, a lower electrode, the piezoelectric body film according to claim 1, and an upper electrode in this order, the method comprising:
a step of obtaining an electrode-attached substrate by forming the lower electrode on the substrate;
a step of depositing a perovskite-type oxide on the electrode-attached substrate using a vapor-phase growth method by holding the temperature of the electrode-attached substrate at $T_1$;
a step of obtaining a piezoelectric body film by further depositing a perovskite-type oxide using a vapor-phase growth method by holding the temperature of the electrode-attached substrate on which the perovskite-type oxide is deposited at $T_2$; and
a step of obtaining a piezoelectric element by forming the upper electrode on the piezoelectric body film,
wherein $T_1$ and $T_2$ satisfy Expression (3)

$$1.04 < T1/T2 < 1.12. \quad \text{Expression (3)}$$

10. The method for manufacturing a piezoelectric element according to claim 9,
wherein the vapor-phase growth method is sputtering.

11. The piezoelectric body film according to claim 2,
wherein a content of Pb in the perovskite-type oxide is 20.7 atm % or more and less than 22 atm % of the number of all of the atoms in the perovskite-type oxide.

12. The piezoelectric body film according to claim 2,
wherein a ratio in terms of the number of contained atoms of the content of Pb to the content of Nb in the perovskite-type oxide exceeds 7.0.

13. The piezoelectric body film according to claim 3,
wherein a ratio in terms of the number of contained atoms of the content of Pb to the content of Nb in the perovskite-type oxide exceeds 7.0.

14. The piezoelectric body film according to claim 2,
wherein the piezoelectric body film is a columnar crystal film consisting of a columnar crystal of the perovskite-type oxide.

15. The piezoelectric body film according to claim 3, wherein the piezoelectric body film is a columnar crystal film consisting of a columnar crystal of the perovskite-type oxide.

16. The piezoelectric body film according to claim 4, wherein the piezoelectric body film is a columnar crystal film consisting of a columnar crystal of the perovskite-type oxide.

17. The piezoelectric body film according to claim 5, wherein the piezoelectric body film is a columnar crystal film consisting of a columnar crystal of the perovskite-type oxide.

18. The piezoelectric body film according to claim 2, wherein a film thickness is 1 μm or more.

19. The piezoelectric body film according to claim 3, wherein a film thickness is 1 μm or more.

20. The piezoelectric body film according to claim 4, wherein a film thickness is 1 μm or more.

\* \* \* \* \*